United States Patent
Nelhiebel et al.

(10) Patent No.: US 9,523,729 B2
(45) Date of Patent: Dec. 20, 2016

(54) APPARATUS AND METHOD FOR TESTING ELECTRIC CONDUCTORS

(71) Applicant: Infineon Technologies AG, Neubiberg (DE)

(72) Inventors: Michael Nelhiebel, Villach (AT); Bernhard Zagar, Altenberg bei Linz (AT); Achim Osterloh, Drobollach (AT); Petar Fanic, Villach (AT)

(73) Assignee: Infineon Technologies AG, Neubiberg (DE)

( * ) Notice: Subject to any disclaimer, the term of this patent is extended or adjusted under 35 U.S.C. 154(b) by 147 days.

(21) Appl. No.: 14/026,822

(22) Filed: Sep. 13, 2013

(65) Prior Publication Data

US 2015/0077151 A1   Mar. 19, 2015

(51) Int. Cl.
| | |
|---|---|
| *G01R 31/02* | (2006.01) |
| *G01R 1/07* | (2006.01) |
| *G01R 31/28* | (2006.01) |
| *G01R 15/20* | (2006.01) |

(52) U.S. Cl.
CPC .............. *G01R 31/021* (2013.01); *G01R 1/07* (2013.01); *G01R 15/207* (2013.01); *G01R 31/2853* (2013.01); *G01R 15/205* (2013.01)

(58) Field of Classification Search
None
See application file for complete search history.

(56) References Cited

U.S. PATENT DOCUMENTS

| | | | | |
|---|---|---|---|---|
| 3,992,663 | A * | 11/1976 | Seddick | G01R 31/2805 324/529 |
| 4,050,013 | A * | 9/1977 | Maddox | G01R 33/025 324/117 R |
| 4,186,338 | A * | 1/1980 | Fichtenbaum | G01R 19/145 324/521 |
| 4,305,661 | A * | 12/1981 | Pryor | G01B 11/00 250/223 B |
| 4,542,333 | A * | 9/1985 | Koontz | G01R 31/026 324/117 H |
| 4,610,710 | A * | 9/1986 | Koontz | G01R 31/026 324/117 H |
| 4,758,786 | A * | 7/1988 | Hafeman | G01R 31/308 324/754.23 |
| 4,916,392 | A * | 4/1990 | Sendeff | G01R 15/207 324/235 |

(Continued)

OTHER PUBLICATIONS

Hoelzl, et al. "Quality Assurance for Wire Connections used in Integrated Circuits via Magnetic Imaging." 2012 IEEE International Instrumentation and Measurement Technology Conference Proceedings. IEEE, 2012. pp. 1-7.

(Continued)

*Primary Examiner* — Jermele M Hollington
*Assistant Examiner* — Suresh K Rajaputra
(74) *Attorney, Agent, or Firm* — Murphy, Bilak & Homiller, PLLC

(57) ABSTRACT

A testing device for testing electric conductors includes a probe configured to measure a magnetic field caused by a current in one or more electric conductors of a device under testing (DUT). An output generator configured to generate output data, wherein the output data depend on the measured magnetic field.

15 Claims, 8 Drawing Sheets

(56) References Cited

U.S. PATENT DOCUMENTS

| | | | | |
|---|---|---|---|---|
| 5,073,754 A * | 12/1991 | Henley | G09G 3/006 | 324/529 |
| 5,125,738 A * | 6/1992 | Kawamura | G01R 31/088 | 250/227.14 |
| 5,138,265 A * | 8/1992 | Kawamura | G01R 31/088 | 324/520 |
| 5,262,726 A * | 11/1993 | Kohmura | G01B 7/107 | 324/226 |
| 5,268,645 A * | 12/1993 | Prokoff | G01R 31/2805 | 324/530 |
| 5,270,661 A * | 12/1993 | Burnett | G01R 31/11 | 324/527 |
| 5,298,858 A * | 3/1994 | Harrison | G01N 27/9046 | 324/235 |
| 5,352,984 A * | 10/1994 | Piesinger | G01R 31/11 | 324/528 |
| 5,406,209 A * | 4/1995 | Johnson | G01R 31/311 | 324/501 |
| 5,422,498 A * | 6/1995 | Nikawa | G01R 31/311 | 257/431 |
| 5,475,695 A * | 12/1995 | Caywood | G01R 31/318307 | 700/108 |
| 5,578,930 A * | 11/1996 | Sheen | G01R 31/046 | 324/529 |
| 5,596,283 A * | 1/1997 | Mellitz | G01R 31/2808 | 324/537 |
| 5,714,888 A * | 2/1998 | Naujoks | G01R 31/308 | 324/501 |
| 5,717,326 A * | 2/1998 | Moriwaki | G01R 15/18 | 324/117 H |
| 5,821,759 A * | 10/1998 | Scaman | G01R 31/281 | 324/529 |
| 6,084,396 A * | 7/2000 | Rao | G01R 15/245 | 324/244.1 |
| 6,107,806 A * | 8/2000 | Field | G09G 3/006 | 324/127 |
| 6,118,279 A * | 9/2000 | Field | G09G 3/006 | 324/529 |
| 6,150,809 A * | 11/2000 | Tiernan | G01N 27/82 | 324/225 |
| 6,323,653 B1 * | 11/2001 | Field | G09G 3/006 | 324/529 |
| 6,459,272 B1 * | 10/2002 | Yamashita | G01R 31/2805 | 324/529 |
| 6,496,013 B1 * | 12/2002 | Buks | G01R 29/0878 | 324/538 |
| 6,529,019 B1 * | 3/2003 | King | G01R 31/2853 | 324/754.29 |
| 6,563,308 B2 * | 5/2003 | Nagano | G01B 11/0608 | 324/229 |
| 6,593,156 B2 * | 7/2003 | Nikawa | G01R 31/311 | 324/754.23 |
| 6,610,918 B2 * | 8/2003 | Nikawa | G01R 31/311 | 136/225 |
| 7,009,405 B2 * | 3/2006 | Bae | G09G 3/006 | 324/529 |
| 7,071,716 B2 * | 7/2006 | Swart | G01R 31/2808 | 324/756.01 |
| 7,250,785 B2 * | 7/2007 | Kawaike | G01R 31/315 | 324/754.29 |
| 7,317,319 B2 * | 1/2008 | Kazama | G01R 33/025 | 324/632 |
| 7,403,001 B1 * | 7/2008 | Bailey, III | G01B 7/105 | 324/222 |
| 7,482,814 B2 * | 1/2009 | Schill, Jr. | G01R 29/0878 | 324/260 |
| 7,486,082 B2 * | 2/2009 | Hachisuka | G01R 15/18 | 324/103 R |
| 7,821,278 B2 * | 10/2010 | Romanov | G01R 31/2805 | 324/756.07 |
| 7,825,673 B2 * | 11/2010 | Nikawa | G01R 31/311 | 250/492.2 |
| 7,987,071 B1 * | 7/2011 | Dorfman | G01R 15/148 | 702/183 |
| 8,179,143 B2 * | 5/2012 | Yeh | G01R 31/2806 | 324/522 |
| 8,269,505 B2 * | 9/2012 | Cases | G01R 31/2812 | 324/527 |
| 8,704,545 B2 * | 4/2014 | Volpert | G01R 31/2886 | 324/756.05 |
| 8,773,107 B2 * | 7/2014 | Jackson | G01R 29/0814 | 324/228 |
| 8,779,757 B2 * | 7/2014 | Ausserlechner | G01R 15/207 | 324/117 R |
| 2001/0004210 A1 * | 6/2001 | Harada | G01N 27/023 | 324/224 |
| 2003/0006786 A1 * | 1/2003 | Kazama | G01R 29/0871 | 324/754.27 |
| 2005/0285602 A1 * | 12/2005 | Field | G09G 3/006 | 324/529 |
| 2006/0023333 A1 * | 2/2006 | Hachisuka | B82Y 10/00 | 360/66 |
| 2006/0164115 A1 * | 7/2006 | Komiya | G01R 31/311 | 324/754.21 |
| 2010/0126755 A1 * | 5/2010 | Chang | H01B 5/02 | 174/126.1 |
| 2010/0174349 A1 * | 7/2010 | Stevenson | G01R 33/285 | 607/116 |
| 2011/0298454 A1 * | 12/2011 | Ausserlechner | G01R 15/207 | 324/252 |
| 2012/0153745 A1 * | 6/2012 | Pagani | H01L 23/5227 | 307/104 |

OTHER PUBLICATIONS

Zagar, Philipp. "Detektion defekter Bondverbindungen über die Analyse ihres Magnetfeldes." Vienna University of Technology, Wien. Aug. 2011. pp. 1-36.

* cited by examiner

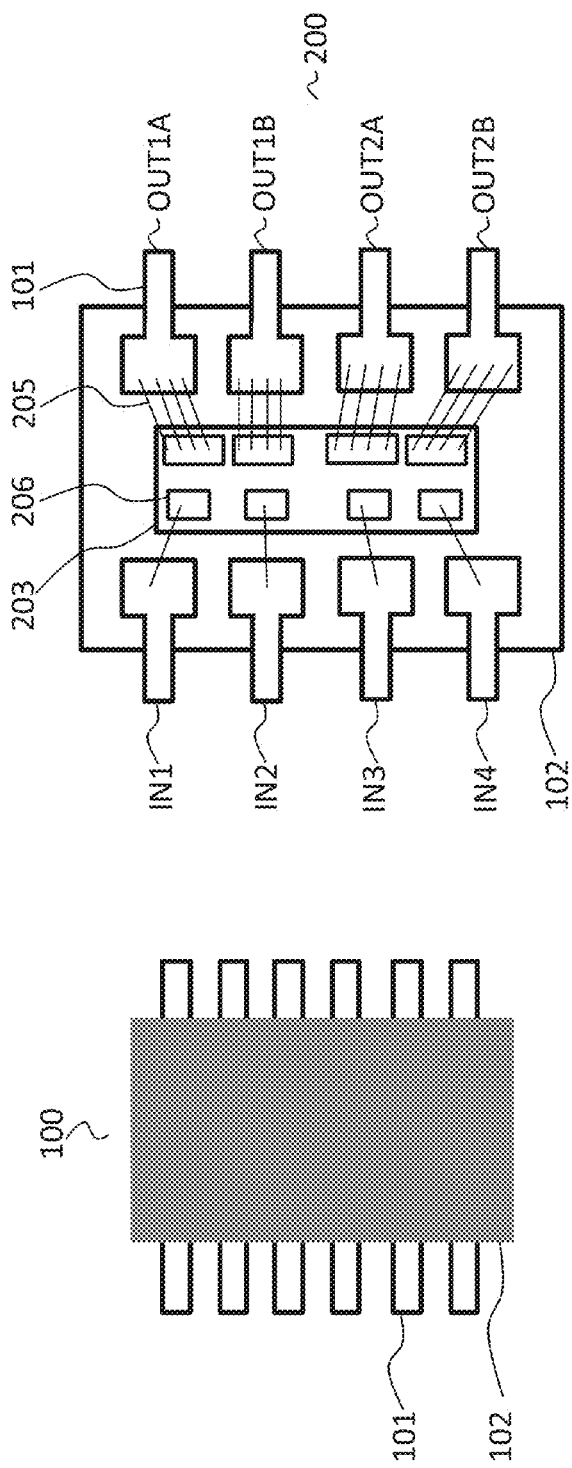
Fig. 1
Fig. 2A
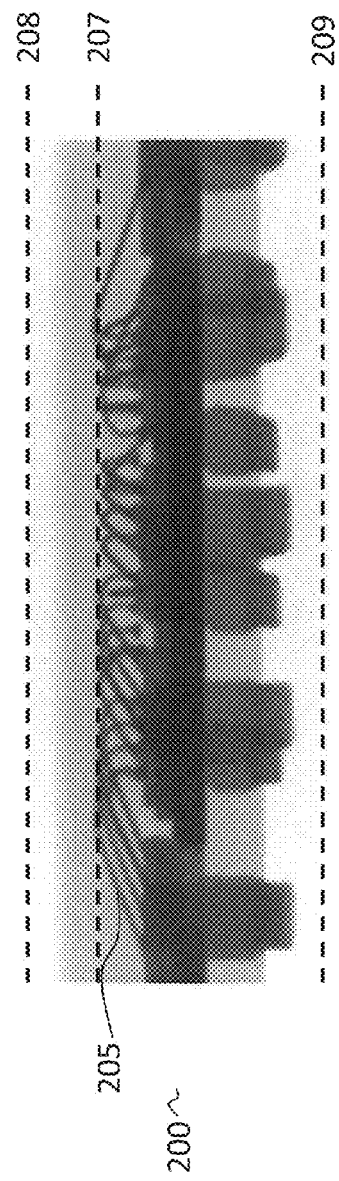
Fig. 2B

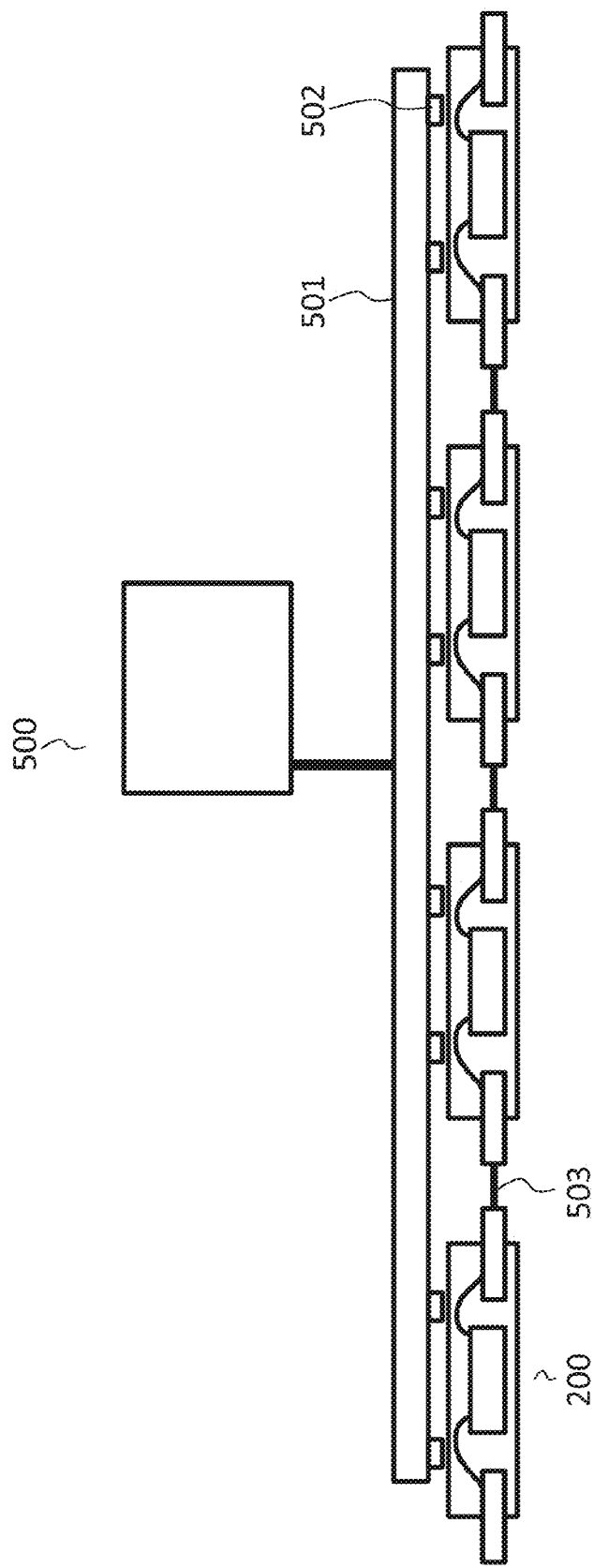

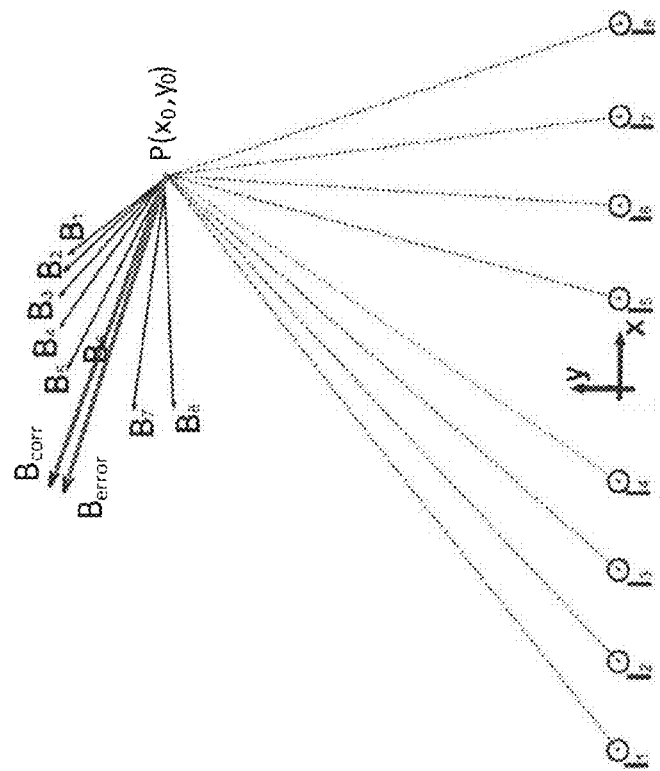
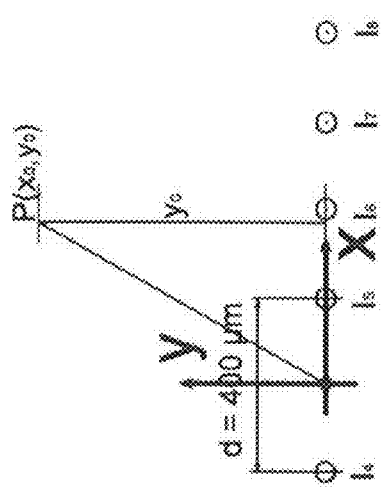
Fig. 6B
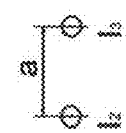
Fig. 6A

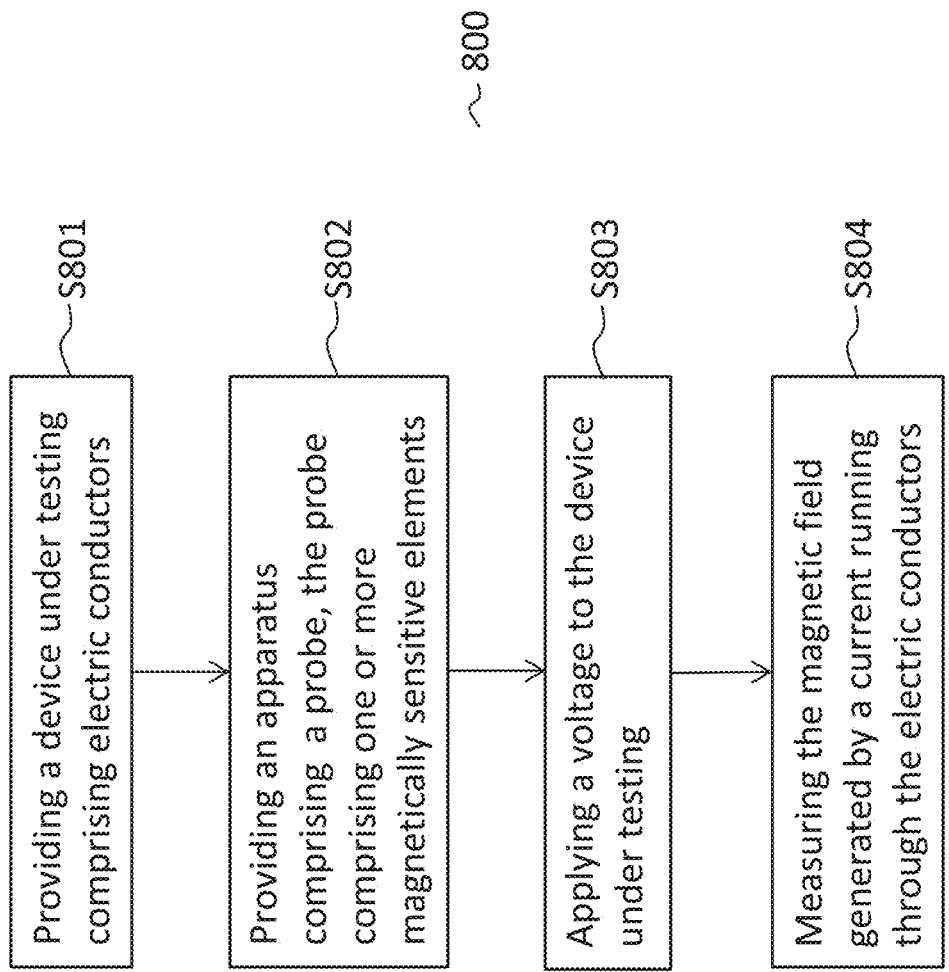

APPARATUS AND METHOD FOR TESTING ELECTRIC CONDUCTORS

TECHNICAL FIELD

The present invention relates to an apparatus and a method for testing electric conductors.

BACKGROUND

Packaged semiconductor devices may comprise electric conductors between connecting pads on the semiconductor element and pins on the outer surface of the package. For example, bonding wires may be used as such electric conductors. Among a multitude of fabricated semiconductor devices, some devices may exhibit deficient electric conductors, for example incomplete wire-bonding. Incomplete bonding may lead to an increased electrical resistance of the wire or even to complete disconnection. Incomplete wire-bonding in individual semiconductor devices may be detected directly during the bonding process: if the bonding apparatus detects a deficient bond, i.e. the wire is not attached solidly with both ends, the apparatus stops. Since the devices may not be singulated at this point of the fabrication process and may be, for example, be to a strip, it may not be economically efficient to remove the whole strip from further fabrication. Known means of sorting out the defective unit include manual removal of already bonded wires from this unit in order to make it electrically failing in the final test, which necessitates human interference and thus is costly and error prone.

For these and other reasons there is a need for improvement.

SUMMARY

According to an embodiment, a testing device for testing electric conductors includes a probe configured to measure a magnetic field caused by a current in one or more electric conductors of a device under testing (DUT). The testing device additionally includes an output generator configured to generate output data. The output data being depends on the measured magnetic field.

According to another embodiment, a method of testing electric conductors includes providing a device under testing (DUT), the DUT including one or more first electric conductors. A testing device comprising a first probe configured to measure a first magnetic field caused by an electric current in the one or more first electric conductors is provided. A voltage is applied to the DUT such that an electric current may flow through the one or more first electric conductors. The first magnetic field is measured.

According to another embodiment, a method for dividing devices into groups includes measuring a magnetic field above the devices, deciding for each of the devices if a criterion is met based on the measurement, and dividing the devices into groups of devices based on the decision.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 depicts a top view of an example of a semiconductor device.

FIG. 2, which comprises FIGS. 2A, 2B, depicts a top view (FIG. 2A) and a side view (FIG. 2B) of the inner structure of an example of a semiconductor device.

FIG. 4, which comprises

FIG. 5 depicts a side view of an embodiment of an apparatus for measuring the magnetic field above a multitude of devices under testing comprising electric conductors.

FIG. 6, which comprises FIGS. 6A, 6B depicts an example of parallel electrical conducting wires (FIG. 6A) and a magnetic field vector in a given point generated by current flowing through the wires (FIG. 6B). Both a case of a magnetic field generated by all depicted wires carrying current and a case of a magnetic field where one wire does not carry any current are depicted.

FIG. 7, which comprises

FIG. 8 depicts a block diagram of an embodiment of a method for measuring a magnetic field above a device under testing comprising one or more electric conductors.

DETAILED DESCRIPTION

Figure 3:
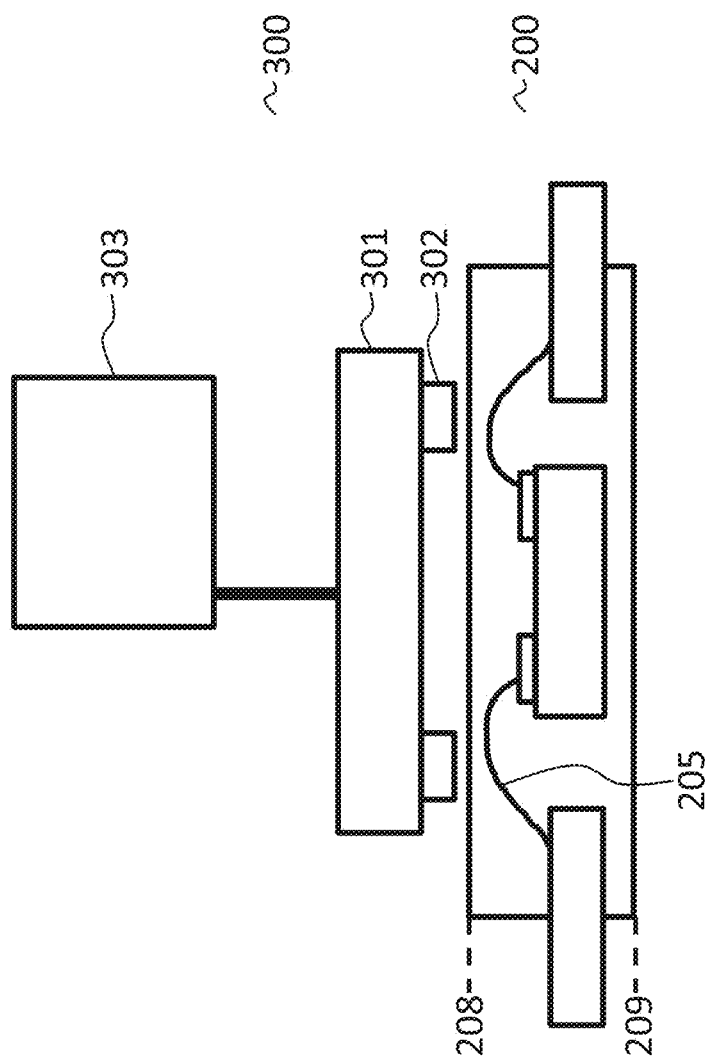
FIG. 3 depicts a side view of an embodiment of an apparatus for measuring the magnetic field above a device under testing comprising electric conductors.

The aspects and embodiments are now described with reference to the drawings. In the following description, for purposes of explanation, numerous specific details are set forth in order to provide a thorough understanding of one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part thereof, and in which is shown by way of illustration specific embodiments in which the invention may be practiced. It may be evident, however, to one skilled in the art that one or more aspects of the embodiments may be practiced with a lesser degree of the specific details. In other instances, known structures and elements are shown in schematic form in order to facilitate describing one or more aspects of the embodiments. In this regard, directional terminology, such as "top," "bottom," "left," "right," "upper," "lower" etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded," "attached," or "connected" elements. Also, the term "exemplary" is merely meant as an example, rather than the best or optimal. The following detailed description, therefore, is not to be taken in a limiting sense, and the scope of the present invention is defined by the appended claims.

The semiconductor devices described further below may be of different types, may be manufactured by different technologies and may include for example integrated electrical, electro-optical or electro-mechanical circuits and/or passives, logic integrated circuits, control circuits, microprocessors, memory devices, etc.

The semiconductor chip(s) need not be manufactured from specific semiconductor material, for example Si, SiC, SiGe, GaAs, GaN, and, furthermore, may contain inorganic and/or organic materials that are not semiconductors, such as for example insulators, plastics or metals.

The semiconductor chips considered herein may be thin. To allow handling or manipulation of the semiconductor chip, e.g. handling/manipulation required for packaging, eWLP (embedded Wafer Level Packaging), or semiconductor device assembly, the semiconductor chip may form part of a composite chip. A composite chip may include the semiconductor chip and a reinforcing chip secured to the semiconductor chip. The reinforcing chip adds stability and/or strength to the composite chip to make it manageable.

The semiconductor chip(s) may have contact pads (or electrodes) that allow electrical contact to be made with the integrated circuits included in the semiconductor chip(s). The electrodes may be arranged all at only one main face(s) of the semiconductor chip(s) or at both main faces of the semiconductor chip(s). The electrodes include one or more electrode metal layers that are applied to the semiconductor material of the semiconductor chip(s). The electrode metal layers may be manufactured with any desired geometric shape and any desired material composition. For example, the electrodes may be made of a material selected of the group of Cu, Ni, NiSn, Au, Ag, Pt, Pd, an alloy of one or more of these metals, an electrically conducting organic material, or an electrically conducting semiconductor material.

The semiconductor chip(s) may be bonded to a carrier. The carrier may be a (permanent) device carrier used for packaging. In some applications, the semiconductor chips may be bonded to a carrier that can be used in the application without packaging. The carrier may be made from any sort of material such as, ceramic or metallic material, copper or copper alloy or iron/nickel alloy. The carrier can be connected mechanically and electrically with one contact element of the semiconductor chip(s). The semiconductor chip(s) can be connected to the carrier by one or more of re-flow soldering, vacuum soldering, diffusion soldering, or adhering by means of a conductive adhesive. If diffusion soldering is used as the connection technology between the semiconductor chip(s) and the carrier, solder materials can be used that result in inter-metallic phases at the interface between the semiconductor and the carrier due to interface diffusion processes after the soldering process. In the case of copper or iron/nickel carriers, it is therefore desirable to use solder materials such as, AuSn, AgSn, CuSn, AgIn, AuIn or CuIn. Alternatively, if the semiconductor chip(s) are to be adhered to the carrier, conductive adhesives can be used. The adhesives can, for example, be based on epoxy resins which can be enriched with particles of gold, silver, nickel or copper to enhance their electrical conductivity.

The contact elements of the semiconductor chip(s) may include a diffusion barrier. The diffusion barrier prevents the solder material from diffusing from the carrier into the semiconductor chip(s), in case of diffusion soldering. A thin titanium layer on the contact element may, for example, effect such a diffusion barrier.

Bonding the semiconductor chip(s) to the carrier may be done by soldering, gluing, or sintering. In the case that the semiconductor chip(s) are attached by soldering, a soft solder material or, in particular, a solder material capable of forming diffusion solder bonds may be used, for example a solder material including one or more metal materials selected from the group of Sn, SnAg, SnAu, SnCu, In, InAg, InCu and InAu.

The semiconductor chip(s) may be covered with an encapsulation material in order to be embedded in an encapsulant (artificial wafer) for eWLP processing or after being bonded to a device carrier (substrate). The encapsulation material may be electrically insulating. The encapsulation material may be made of any appropriate plastic or polymer material such as, a duroplastic, thermoplastic or thermosetting material or laminate (prepreg), and may contain filler materials. Various techniques may be employed to encapsulate the semiconductor chip(s) with the encapsulation material, for example compression molding, injection molding, powder molding, liquid molding or lamination. Heat and/or pressure may be used to apply the encapsulation material.

FIG. 1 shows a top view of an exemplary semiconductor device 100 with a plurality of connectors 101 sticking out of a packaging 102. According to an embodiment, the connectors 101 may be pins and will be referred to as such in the following.

FIG. 2A shows a top view of the inner structure of an example of a semiconductor device 200. The device 200 includes a plurality of pins 101, packaging 202 and semiconductor element 203 including a plurality of pads 206. The plurality of pins 101 may include input pins IN1, IN2, IN3, . . . , and output pins OUT1a, OUT1b, OUT2a, OUT2b. The device 200 further includes bonding wires 205 connecting input pads on the semiconductor element to input pins and output pads to output pins, respectively.

In FIG. 2B, the inner structure of semiconductor device 200 is depicted in a side view. As shown, bonding wires 205 are usually not flat but vertically stick out of the respective pad and span an arc to the respective pin to which they are connected and which they touch almost horizontally. The minimum distance that an outside scanning device can be approached to the bonding wires is the distance between the plane 207 spanned by the top of the arcs and the top surface of the semiconductor device 208.

Some of the pads 206 on the semiconductor element 203, usually input pads, may be low-current pads and may be connected with a single bonding wire to the respective pins. Other pads, typically output pads, may have significant current requirements. For example, some pads may require a current of several tens of amperes. Therefore, such pads may be connected to the respective pins using several parallel bonding wires. In the example shown in FIG. 2A four parallel bonding wires are used to connect each output pad to the respective output pin OUT1a, OUT1b, OUT2a, OUT2b.

During device fabrication, the electrical functionality of bonding wires 205 may be tested, for example by applying a voltage and detecting a current flowing through the bonding wires. However, in the case that more than one bonding wire connects a pad on the semiconductor element 203 to the respective pin, a disconnected bonding wire might not be detected by such a test since the remaining parallel bonding wires ensure electrical connection between pin and pad. Experience shows that missing or deficient bonding wires may be found in 10-100 ppm. During application, that is during high-current situations, a reduced number of parallel bonding wires leads to increased currents flowing through the remaining bonding wires which may lead to over-heating and melt-up of the wires. It may therefore be desirable to ensure the conformance of all bonding wires during testing. That is, the omission of single wires or their deficient bonding should be reliably detected. Purely electrical testing may not be sufficient to achieve this since the contribution of single redundant bonding wires to the electrical signal is usually negligibly small and therefore below the noise level of the electrical test.

Another method for detecting deficient bonding wires is using X-ray inspection. However, this method may be time consuming and expensive. Furthermore, it may not be 100% reliable as it involves human inspection and it may still be only capable of detecting completely disconnected or missing bonding wires but not weak, deficient bonds.

FIG. 3 depicts an embodiment of a apparatus 300 for testing electric conductors, for example bonding wires, in a Device Under Testing (DUT), for example a semiconductor device by measuring the magnetic field generated by a current flowing through the electric conductors. In the embodiment depicted in FIG. 3, the electric conductors are bonding wires 205. According to other embodiments, other electric conductors in semiconductor devices may be tested using apparatus 300, such as, ball grid arrays, solder bumps, solder clips or die attach. The apparatus may include a probe 301 including one or more magnetically sensitive elements 302 and a control unit 303. The magnetically sensitive elements 302 are configured to measure the magnetic field at their respective positions generated by a current flowing through the bonding wires 205. The control unit 303 is configured to process the measurement of the magnetic field. In an embodiment, the control unit 303 compares the measured magnetic field to some stored data in order to control if the measured magnetic field corresponds to a device including deficient bonding wires. In an embodiment, the control unit 303 may compare the magnetic field measured at different points above the DUT. In an embodiment, the control unit 303 may make a decision if the DUT fulfills a predefined criterion based on the measured magnetic field. For example, the control unit 303 may decide that the DUT includes one or more electric conductors that do not meet a certain quality criterion.

Measuring the magnetic field may enable the detection of devices that include weakly bonded wires since weak bonds may increase the electrical resistance and therefore may lead to smaller electrical currents through the wire. Such weakly bonded wires may be hard to detect using electrical testing or X-ray inspection.

Measuring the magnetic field may be fast and may be suitable for on-line screening during fabrication of semiconductor devices.

The apparatus 300 may include further elements which are not shown in FIG. 3. For example, in an embodiment the apparatus may include a mount for fixing a device under testing (DUT) 200 in position for testing. In an embodiment, the apparatus may include a stage configured to arrange the probe 301 in predefined positions above the DUT.

In the embodiment shown in FIG. 3, the probe 301 is positioned above the surface 208. In another embodiment of the apparatus 300, the probe 301 is positioned above the surface 209 opposite the surface 208, that is the surface of the DUT 200 that is further away from the bonding wires 205.

In an embodiment, the probe 301 does not touch the DUT 200, as shown in FIG. 3. In another embodiment, at least some parts of the probe 301 touch the DUT 200.

The magnetically sensitive elements 302 do not necessarily stick out of the surface of the probe 301. The magnetically sensitive elements may also be coplanar with the surface of the probe 301 or may even be recessed.

The probe 301 may include a pair of magnetically sensitive elements 302 as shown in FIG. 3. However, in other embodiments, the probe 301 may include any suitable number of such elements 302. The magnetically sensitive elements may be arranged in any suitable manner and may have any suitable form. In some embodiments, the elements 302 have the form of stripes which are arranged in parallel to one another. The stripes may be a few tens of micrometers long, in particular 100µm or 50µm or 10µm. In another embodiment the elements 302 are arranged in a two dimensional lattice.

In the embodiment shown in FIG. 3, there is a single magnetically sensitive element 302 positioned over the bonding wires 205 at each side of the semiconductor element 203.

According to an embodiment, the apparatus 300 is part of a back end test unit for testing packaged semiconductor devices. According to an embodiment the probe 301 is part of a contact unit of a back end test unit. According to another embodiment, the probe 301 is part of the handler of a back end test unit.

Figure 4B:
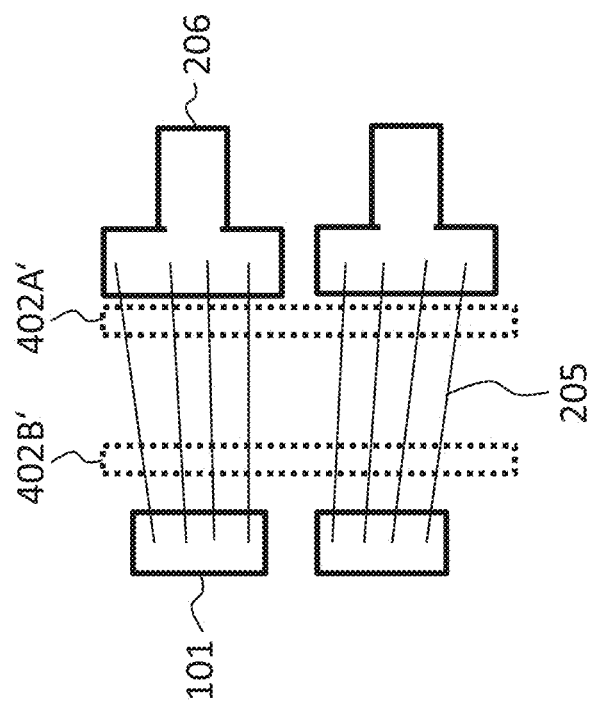
FIGS. 4A, 4B, depicts a top view of an embodiment of a probe comprising magnetically sensitive elements (FIG. 4A) and possible positions of the magnetically sensitive elements above a multitude of bonding wires (FIG. 4B).
Figure 4A:
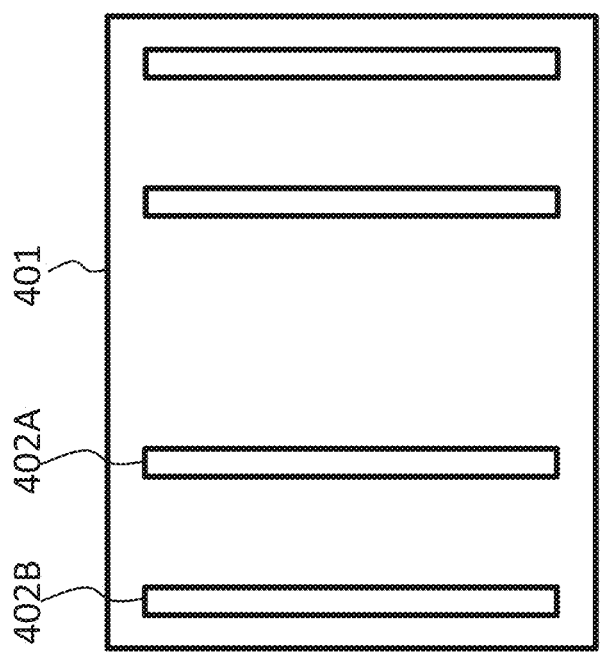

In the embodiment of the probe 401 shown in FIG. 4A, the magnetically sensitive elements 402A, 402B are grouped in pairs such that each pair of elements 402A, 402B is configured to measure the magnetic field generated by the same bonding wires 205. FIG. 4B shows the positions 402A', 402B' at which a pair of magnetically sensitive elements 402A, 402B of probe 401 is located above a multitude of bonding wires 205. Element 402A is positioned closer to the bonding pads 206 and element 402B is positioned closer to the pins 101.

In other embodiments the positions 402A', 402B' may be different from the positions shown in FIG. 4B. For example, the magnetically sensitive elements may be positioned directly above the pins 101 or directly above the pads 206 or at any other suitable position.

Measuring the magnetic field of a conductor in more than one place may improve the accuracy of the measurement. In particular, in a semiconductor device including one or more deficient electric conductors it may help to define which electric conductors are deficient and which are not. According to an embodiment, a known good reference sample may be measured together with the DUT. This may help to improve the accuracy of the test. According to an embodiment, the known good reference sample provides a reference signal which a testing algorithm may subtract from the signal obtained from the DUT. This subtraction may take place during measurement. Subtraction may provide a "null-signal" for good DUTs, that is for DUTs that do not have a malfunctioning electric conductor. The null-signal may be amplified and may therefore allow for a higher resolution of the measurement of a defective device compared to purely comparing the distinct signals of a DUT and a known good reference sample. The DUT and the known good reference sample may be tested in parallel. Note that more than one reference sample may be used at once.

In one embodiment of the apparatus for measuring the magnetic field of electric conductors included in semiconductor devices the magnetically sensitive elements 302, 402A, 402B are Giant Magneto-Resistance (GMR) elements. GMR elements may be very sensitive, may execute measurements quickly and may be small enough to be used in this application. In other embodiments, other suitable magnetically sensitive elements apart from GMR elements may be used.

In an embodiment, the GMR elements are configured as single axis magnetic field sensors. In another embodiment the GMR elements are configured as triple axis magnetic field sensors configured to measure all three spatial components of the magnetic field.

The magnetically sensitive elements may have a high spatial resolution of a few micro-meters, in particular 20μm or 10μm or better than 10μm. The magnetically sensitive elements may have a high resolution of the magnetic field strength. In particular, they may have a resolution of 0.5 mT or 0.2 mT or 0.1 mT or 0.05 mT or better than 0.05 mT.

FIG. 5 shows another embodiment of an apparatus 500 for measuring the magnetic field of electric conductors included in semiconductor devices. According to this embodiment, the probe 501 is configured to test a multitude of semiconductor devices 200 simultaneously. In one embodiment, as shown in FIG. 5, the semiconductor devices are connected to one another via links 503. The links 503 may for example be realized by a temporal carrier to which the multitude of semiconductor devices 200 is attached. In another embodiment of the apparatus 500, the semiconductor devices 200 are singulated devices.

In another embodiment the apparatus 500 includes more than one probe 501, wherein each probe 501 is configured to test a single DUT. In another embodiment, each probe is configured to test several DUTs simultaneously.

FIG. 6A shows two quartets of bonding wires $I_1, \ldots, I_4$ and $I_5, \ldots, I_8$ carrying a current that flows out of the plane of the drawing. The bonding wires in the two quartets have a distance to one another of about a=200 μm and the two quartets are 400 μm apart. At point $P(x_0, y_0)$, wherein $y_o$ is the vertical distance of the point from the plane spanned by the wires $I_1, \ldots, I_8$, the magnetic field generated by the current in the wires may be measured using an embodiment of the apparatus described above in connection with FIGS. 3-5. In FIG. 6B the magnetic field vector in point $P(x_0, y_0)$ is depicted schematically. $B_{corr}$ denotes the magnetic field vector in the case that all bonding wires $I_1, \ldots, I_8$ work correctly, that is all wires carry the intended current and no wire exhibits an unusually high electrical resistance. $B_{error}$ denotes the magnetic field vector in the case that one or more of the bonding wires $I_1, \ldots, I_8$ exhibits an electrical resistance that is out of the bounds of the manufacturer's specifications.

In the following, a mathematical model of a layout of a magnetic field of a multitude of bonding wires is illustrated. The model assumes infinitely long electrically conducting wires.

At a distance y the magnetic field is modeled along the x-axis as defined in FIGS. 6A, 6B. In the model, each of eight electrical conducting wires carries a current of 3.6 A. Modeling was performed along two parallel lines as defined in FIG. 4B. Along line 402A' the distance a (distance from one wire to the next) is 100 μm and the distance y (vertical distance to the plane of measurement) is 500 μm. Along line 402B' the distance a is 200 μm and the distance y is 820 μm.

Figures 7A, 7B:
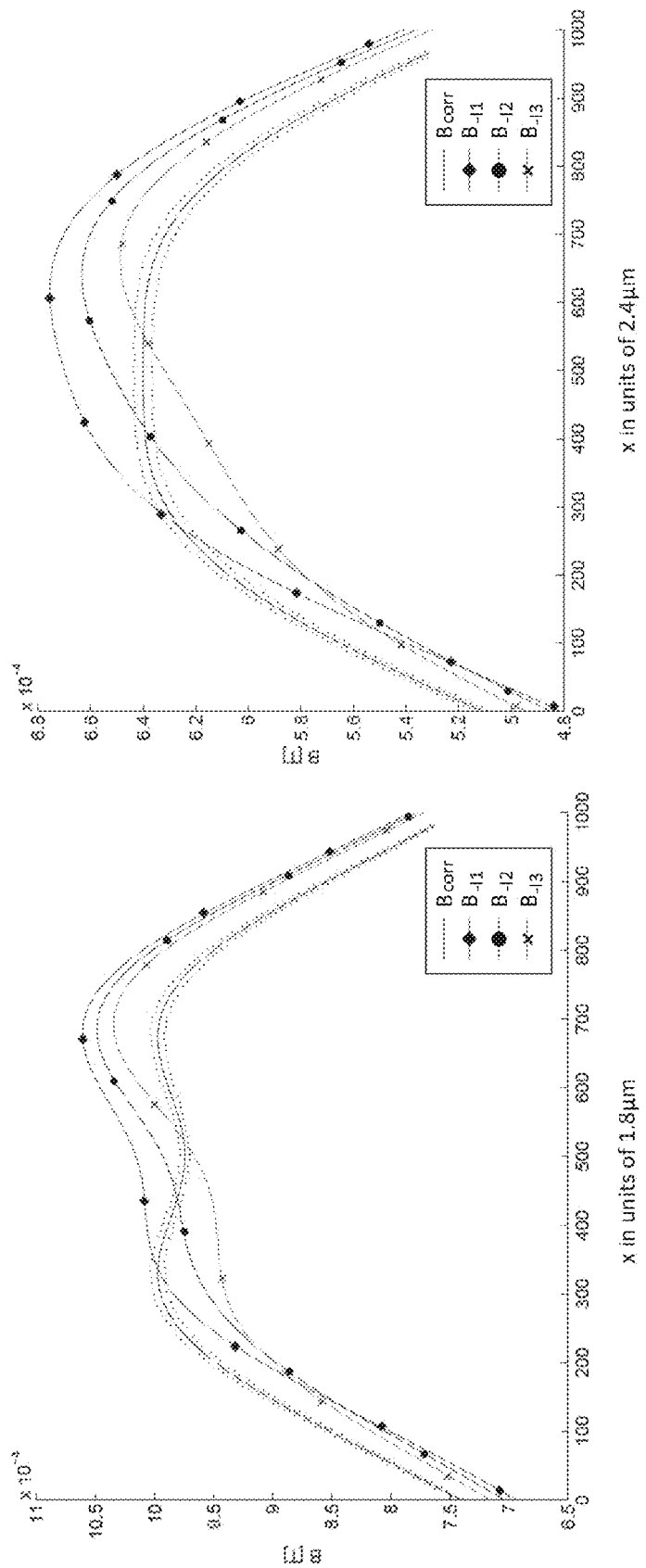
FIGS. 7A, 7B, depicts a magnetic field strength above a multitude of wires carrying electric current. Both a case of a magnetic field generated by all depicted wires carrying current and a case of a magnetic field where some wires do not carry any current are depicted.

In FIG. 7A, the magnetic field strength along line 402A' is shown. Conversely, FIG. 7B shows the magnetic field strength along line 402B'. The dotted curves above and below the curve corresponding to $B_{corr}$ show the course of $B_{corr}$ in the case that the vertical distance y is off by 1%.

FIGS. 7A, 7B show the magnetic field strength both for the case that the current in all eight bonding wires is within specifications and for the case that individual wires do not carry any current. $B_{-I1}$ shows the magnetic field strength in the case that current $I_1$ is missing, $B_{-I2}$ shows the case that current $I_2$ is missing and $B_{-I3}$ shows the case that $I_3$ is missing. In the case that all bonding wires work correctly, that is $B_{corr}$ is detected, no significant difference of the signal measured at symmetry positions x=300 and x=700 is found. However, in the case that one or more bonding wires do not work according to specifications, a significant difference in the signal measured at these positions can be detected.

Note that the difference between the measured magnetic field of a device wherein all bonding wires work correctly and a device wherein one bonding wire is defective becomes smaller when more parallel bonding wires are used to connect a pad to the respective pin. The fewer the parallel wires, the bigger the distortion of the magnetic field will be in the case that a wire does not work properly. In the case that eight wires are supposed to carry the same current and one wire fails completely, the magnetic field strength may deviate by about 6% from a device including no defective electrical conductor.

FIG. 8 shows an embodiment of a method 800 for testing semiconductor devices by measuring the magnetic field generated by a current flowing through electric conductors within the device. The method includes steps S801-S804. Step S801 includes providing a DUT including one or more electric conductors. In an embodiment of method 800, the DUT is a semiconductor device. In an embodiment of this embodiment, the electric conductors are bonding wires.

Step S802 includes providing an apparatus for measuring a magnetic field, the apparatus includes a probe configured to measure the magnetic field generated by a current flowing through the electric conductors within the DUT, wherein the probe includes one or more magnetically sensitive elements. In one embodiment, these elements are GMR elements. In one embodiment, the elements are configured as stripes. In one embodiment, the elements are configured as pairs of stripes. In one embodiment, the stripes are arranged perpendicular to a multitude of parallel electric conductors within the DUT.

Step S803 includes applying a voltage to the DUT such that a current may flow through the electric conductors. In one embodiment, the voltage is applied such that the direction of the current in electric conductors aligned in parallel is the same. That is, for example, the DUT is the semiconductor device shown in FIG. 2A and the voltage is applied such that the direction of electric current points from the pads on the semiconductor element 203 to the pins OUT1a, ..., OUT2b. In another embodiment, voltage is applied to the DUT such that current flows in anti-parallel directions. That is, in the example above the direction of current may point from the pads to pins OUT1a, OUT1b in the first eight bonding wires from above in FIG. 2A and from pins OUT2a, OUT2b to the pads in the second eight bonding wires. According to an embodiment, of method 800 the voltage during $R_{DS(on)}$ testing is used as the voltage of step S803.

Step S804 includes measuring the magnetic field generated by a current flowing through the electric conductors. In an embodiment of method 800, the magnetic field is measured at more than one point, in particular in two points, over each electrical conductor.

An embodiment of method 800 further includes a step wherein the measured magnetic field is compared to some reference data. An embodiment of method 800 further includes a step wherein the difference in the measured magnetic field at two points, for example at points x=300 and x=700 in FIGS. 7A, 7B is calculated.

An embodiment of method 800 includes providing a multitude of DUTs in step S801 and in step S802 providing an apparatus includes a multitude of probes for measuring the magnetic field of the DUTs. An embodiment of method 800 includes providing in step S802 an apparatus includes a probe configured to measure the magnetic field of a multitude of DUTs.

According to an embodiment, method 800 is integrated into the back end testing of semiconductor devices. According to an embodiment, the method 800 uses automatic test equipment. The method 800 may be independent of human interaction and may not introduce any additional risk of damaging the DUTs.

Measuring the magnetic field according to method 800 may be fast. In particular, measuring may take no more than 200 ms or no more than 100 ms or no more than 50 ms and preferably no more than 20 ms. Method 800 may take no longer than the electrical back end testing of packaged semiconductor devices.

Figure 9:
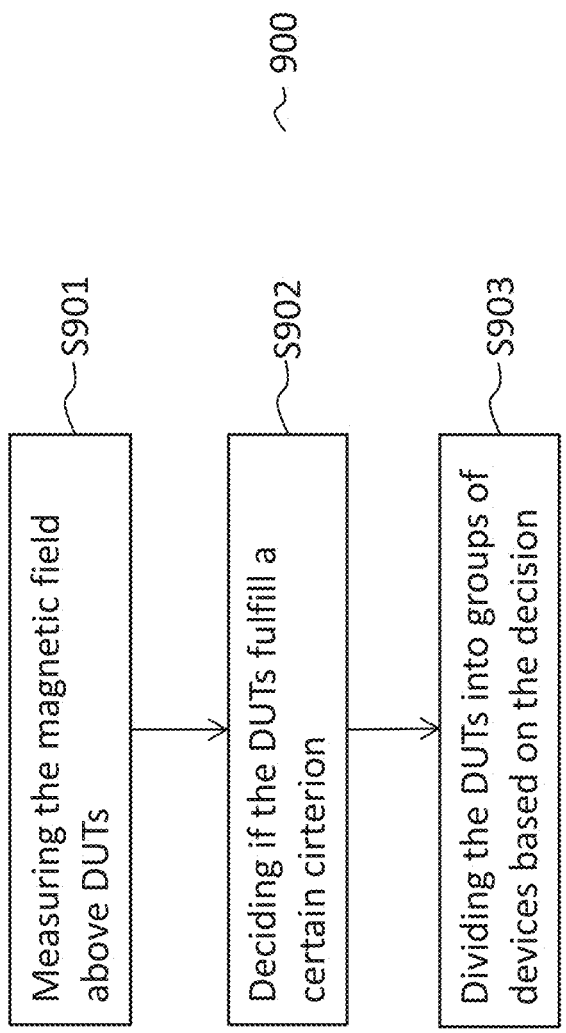
FIG. 9 depicts a block diagram of an embodiment of a method for dividing devices under testing into groups.

FIG. 9 shows a method 900 including steps S901-S902 for dividing DUTs into groups based on a predefined criterion. Step S901 includes measuring the magnetic field above the DUTs. Step S902 includes deciding if individual DUTs fulfill a predefined criterion based on the measurement. Step S903 includes dividing the DUTs into groups of devices based on the decision.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A testing device for testing electric conductors, comprising:
    a probe configured to measure a magnetic field caused by a current flowing through at least two bonding wires of a semiconductor device when a voltage is applied to the semiconductor device, wherein the at least two bonding wires are arranged in a parallel connection; and
    a control unit configured to decide whether one or more of the least two bonding wires is electrically defective, wherein the decision depends on the measured magnetic field.

2. The device according to claim 1, wherein the testing device is configured to test more than one semiconductor device simultaneously.

3. The device according to claim 1, further comprising:
    a positioning stage configured to arrange the probe in predefined positions over the bonding wires of the semiconductor device.

4. The device according to claim 1, wherein the probe comprises one or more giant magneto resistance elements.

5. The device according to claim 1, wherein the control unit is configured to generate output data when the semiconductor device comprises one or more defective electric conductors and to generate different output data when the semiconductor device comprises no defective conductors.

6. The device according to claim 1, wherein the control unit is configured to generate output data when the semiconductor device comprises a specific defective electric conductor and to generate different data output from a semiconductor device wherein the specific electric conductor is not defective.

7. The device according to claim 1, wherein the probe comprises a single axis magnetic field sensor.

8. The device according to claim 1, wherein the probe comprises a triple axis magnetic field sensor.

9. A method of testing electric conductors, the method comprising:
    providing a semiconductor device, the semiconductor device comprising at least two bonding wires, wherein the at least two bonding wires are arranged in a parallel connection;
    providing a testing device comprising a first probe configured to measure a first magnetic field caused by an electric current in the at least two bonding wires;
    applying a voltage to the semiconductor device such that the electric current may flow through the at least two bonding wires;
    measuring the first magnetic field; and
    deciding whether one or more of the at least two bonding wires is electrically defective.

10. The method according to claim 9, further comprising:
    providing a reference device, the reference device comprising one or more second electric conductors;
    providing a second probe configured to measure a second magnetic field caused by an electric current in the one or more second electric conductors;
    applying a voltage to the reference device such that an electric current may flow through the one or more second electric conductors;
    measuring a second magnetic field caused by the electric current in the one or more second electric conductors; and generating a data output by subtracting measurement data of the second magnetic field from measurement data of the first magnetic field.

11. The method according to claim 10, further comprising:
comparing the data output to some reference data; and
deciding if the semiconductor device meets a certain criterion based on the comparison.

12. The method according to claim 9, further comprising:
producing a data output in the testing device, wherein the data output depends on the measured magnetic field; and
comparing the output with some reference data.

13. The method according to claim 9, further comprising generating data output in the testing device from a semiconductor device comprising one or more defective conductors and generating different data output from a semiconductor device comprising no defective conductors.

14. The method according to claim 9, further comprising generating data output in the testing device from a semiconductor device comprising a specific defective electric conductor and generating different data output from a semiconductor device wherein the specific electric conductor is not defective.

15. The method according to claim 9, further comprising:
comparing the magnetic field measured at different points above the semiconductor device.

\* \* \* \* \*